United States Patent [19]

Ohshima et al.

[11] Patent Number: 4,837,178
[45] Date of Patent: Jun. 6, 1989

[54] METHOD FOR PRODUCING A SEMICONDUCTOR INTEGRATED CIRCUIT HAVING AN IMPROVED ISOLATION STRUCTURE

[75] Inventors: Toshio Ohshima; Naoki Yokoyama, both of Atsugi, Japan

[73] Assignee: Fujitsu Limited, Kawasaki, Japan

[21] Appl. No.: 94,091

[22] Filed: Sep. 4, 1987

Related U.S. Application Data

[62] Division of Ser. No. 792,686, Oct. 29, 1985, abandoned.

[30] Foreign Application Priority Data

Oct. 31, 1984 [JP] Japan .................. 59-229181

[51] Int. Cl.$^4$ .............................. H01L 21/31
[52] U.S. Cl. ........................ 437/33; 437/67; 437/78
[58] Field of Search ............ 437/78, 133, 67, 33; 148/DIG. 65

[56] References Cited

U.S. PATENT DOCUMENTS

| | | | |
|---|---|---|---|
| 4,534,824 | 8/1985 | Chen | 437/35 |
| 4,553,152 | 11/1985 | Nishitani | 357/16 |
| 4,573,064 | 2/1986 | McLevige et al. | 357/34 |
| 4,575,924 | 3/1986 | Reed et al. | 437/78 X |
| 4,608,696 | 8/1986 | Law et al. | 357/41 |
| 4,649,411 | 3/1987 | Birrittella | 357/36 |

FOREIGN PATENT DOCUMENTS

| | | | |
|---|---|---|---|
| 0045181 | 2/1982 | European Pat. Off. | 437/133 |
| 0050064 | 4/1982 | European Pat. Off. | 357/22 MD |
| 0119089 | 9/1984 | European Pat. Off. | |
| 0143656 | 6/1985 | European Pat. Off. | |
| 59-54271 | 3/1984 | Japan | 357/22 MD |

OTHER PUBLICATIONS

Blum et al., IBM Tech. Disc. Bull., vol. 13, No. 9 (Feb. 1971), p. 2494.

*Primary Examiner*—Olik Chaudhuri
*Attorney, Agent, or Firm*—Staas & Halsey

[57] ABSTRACT

A compound semiconductor (e.g., GaAs) IC device structure includes: a compound semiconductor substrate having a semi-insulating compound surface region; an active element laminated layer formed on the surface region; an isolation region of a semi-insulating (intrinsic) compound semiconductor which is filled in a groove extending into the surface region through the laminated layer; and active elements formed in regions of the laminated layer, isolated by the filled groove.

6 Claims, 4 Drawing Sheets

METHOD FOR PRODUCING A SEMICONDUCTOR INTEGRATED CIRCUIT HAVING AN IMPROVED ISOLATION STRUCTURE

This is a divisional of application Ser. No. 792,686, filed on Oct. 29, 1985, now abandoned.

BACKGROUND OF THE INVENTION

1. Field of the Invention

The present invention relates to a semiconductor device. More particularly, it relates to an integrated circuit (IC) device of a compound semiconductor and a method for producing the same. The present invention also relates to an improvement of the isolation of active elements (i.e. active regions) from each other in the compound semiconductor IC device.

2. Description of the Related Art

In silicon semiconductor IC devices it is necessary to form an isolation region or structure such as a PN junction, or insulating layer. In general, there has been no special need to form an isolation region in GaAs FET IC devices, since a channel region, source region, and drain region of each GaAs FET are formed in a semi-insulating GaAs substrate by an ion-implantation method. Recently, however, IC devices, such as FETs utilizing a two-dimensional electron gas and heterojunction bipolar transistors, are produced by using a laminated layer structure formed on a substrate by molecular beam epitaxy (MBE) or metal organic chemical vapor deposition (MOCVD). In this case, it is necessary to form an isolation region in the laminated layer so as to isolate the active elements (regions) from each other. Such an isolation can be achieved by etching portions of the laminated layer between active regions thereof so as to form island active regions (e.g., cf. FIG. 1 of U.S. Ser. No. 676,359 filed on Nov. 29, 1984, corresponding to EP-A-0143656). In this type of isolation, steps formed by etching tend to cause breaking of interconnection conductor (i.e., a so-called step-coverage failure), and a base area of each island (i.e. active region is increased, preventing an increase in integration degree.

Isolation can be also achieved by implanting ionse, such as hydrogen (H+) and oxygen (O+) into portions of the laminated layer except for the active regions, to make those portions inactive (e.g., cf. FIG. 10 of U.S. Ser. No. 587,967 filed on March 9, 1984, corresponding to EP-A-0119089). In this type of isolation, the resistivity of the isolation region is reduced by a heat-treatment carried out in a later production step. During the heat-treatment, the introduced ions diffuse and increase the area of the isolation region, also preventing an increase in integration degree. It is difficult to carry out a deep inactivation by the ion-implantation method. Especially where oxygen ions are implanted, carriers trapped at a gap center are apt to be excited when an electric field is applied to the ion-introduced region, so that a current may flow Furthermore, it is possible for isolation to be achieved by a combination of etching and filling, namely, etching a portion of the laminated layer around the active regions to form a U-shaped or V-shaped groove and filling the groove with an insulating material, such as $SiO_2$, $Si_3N_4$, and polycrystalline silicon. Such a combination process is adopted, for example, in a V-groove Isolation Polycrystal backfill structure (VIP), and in a U-groove isolation structure (wherein the U-groove is formed by a reactive ion etching (RIE) and filled with the insulating material), for silicon IC devices. However, where the U-shaped or V-shaped groove is formed in the laminated layer of the GaAs IC devices and is filled with $SiO_2$, $Si_3N_4$ and the like, the difference in the thermal expansion coefficient between GaAs and $SiO_2$ ($Si_3N_4$) produces an internal stress which may cause cracks during a heat-treatment. The thermal expansion coefficients of GaAs, $SiO_2$, and $Si_3N_4$ are $8.7 \pm 0.1 \times 10^{-6}$ (1/K), 5 to $6 \times 10^{-7}$(1/K), and 3 to $5 \times 10^{-6}$(1/K), respectively. In this case, when GaAs is etched in the later step, the filled insulating material is not etched, so that a step is formed at the end of the isolation region. Such a step may bring about a step-coverage failure of an interconnection conductor.

SUMMARY OF THE INVENTION

An object of the present invention is to provide isolation for GaAs IC devices without the above-mentioned disadvantages.

Another object of the present invention is to provide a compound semiconductor IC device with an improved isolation structure.

In order to achieve isolation of a compound semiconductor IC device, according to the present invention, a groove is formed by selectively etching a laminated layer and a portion of a semi-insulating compound semiconductor substrate and the groove is then filled with a semi-insulating (i.e., intrinsic) compound semiconductor.

Since the filler compound semiconductor material is similar to or the same as the laminated layer and the substrate, regardless of conductivity type and impurity concentration, the thermal expansion coefficient and the crystal lattice of the former are almost the same as that of the latter. Accordingly, any internal stress occurring during a heat-treatment is very small. Furthermore, the filler compound semiconductor is epitaxially grown in the groove, so that the interface of the filler to the laminated layer and substrate has good physical and electrical properties.

The compound semiconductor of the substrate, each layer of the laminated layer, and the filler each comprise a III–V Group compound semiconductor including $Ga_xIn_{1-x}As_xP_{1-x}$, $Ga_xAl_{1-x}As_yP_{1-y}$, $Ga_xAl_{1-x}As_xSb_{1-x}$, $In_xGa_yAl_{1-x-y}P$, $In_xAl_{1-x}P_xAs_{1-x}$, $In_xAl_{1-x}P_xSb_{1-x}$, and $Ga_xAl_{1-x}P_xSb_{1-x}$: wherein, $0 \leq x \leq 1$ and $0 \leq y \leq 1$.

Where each layer of the laminated layer has a first conductivity type (e.g., n-type or p-type), the filler compound semiconductor may have a second conductivity type opposite that of the first conductivity type (e.g., p-type or n-type). Where the laminated layer comprises an n-type layer and a p-type layer, and in the above case also, the filler compound semiconductor is an intrinsic (i.e., undoped) semiconductor.

Note, silicon- IC devices have neither an intrinsic semiconductor isolation region nor a filler PN junction isolation structure.

BRIEF DESCRIPTION OF THE DRAWINGS

The present invention and its objects and features will be made more apparent during the course of the detailed description set forth below, rendered with reference to the accompanying drawings, in which.

DESCRIPTION OF THE PREFERRED EMBODIMENTS

Referring to FIGS. 1 to 5, a GaAs IC device comprising hetero-bipolar transistors and a method of producing the device according to a preferred first embodiment of the present invention are now described.

Figure 1:
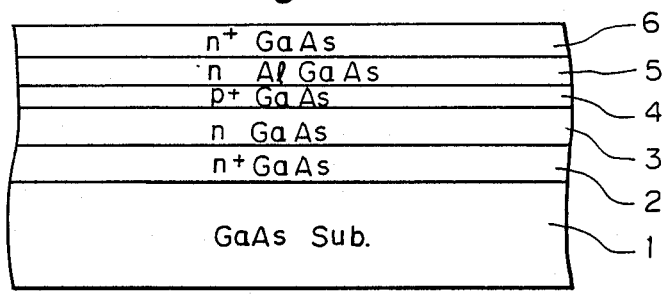
FIGS. 1 to 5 are schematic partially sectional views of a GaAs IC device in various stages of production in accordance with an embodiment of the present invention.

As illustrated in FIG. 1, on a semi-insulating GaAs substrate (wafer) 1, an $n^+$-type GaAs layer 2 (e.g., 900 nm thick), an n-type GaAs layer 3 (e.g., 500 nm thick), a $p^+$-type GaAs layer 4 (e.g., 100 nm thick), an n-type AlGaAs layer 5 (e.g., 150 nm thick) and an $n^+$-type GaAs layer 6 (e.g., 150 nm thick) are epitaxially formed in sequence by a MBE method. It is also possible to form the layers 2 to 6 by a MOCVD method.

Figure 2:
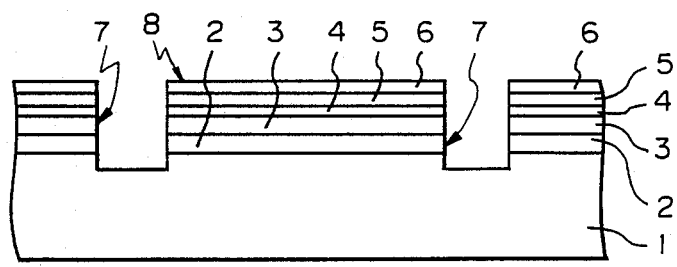

The GaAs layer 6 is covered with a suitable masking layer (not shown) having an opening corresponding to an isolation region pattern. The laminate of layers 2 to 6 and a portion of the substrate 1 are then selectively etched by a dry etching method (e.g., RIE method) or an ion-milling method using argon ions ($Ar^+$), to form a U-shaped groove 7, as shown in FIG. 2. The groove 7 surrounds an island active region 8. The width of the groove 7 is from 0.3 to 5 $\mu$m.

Figure 3:
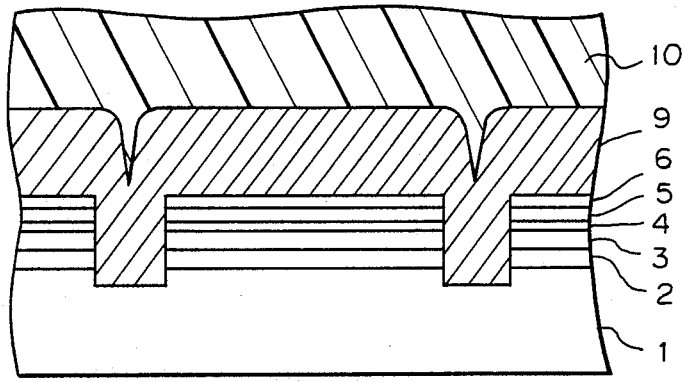

As illustrated in FIG. 3, an undoped (i.e., intrinsic) GaAs layer 9 is deposited on the entire surface of the laminate of layers 2 to 6 by a MOCVD method, a chemical vapor deposition (CVD) method or a liquid phase epitaxy (LPE) method, so as to fill the U-shape groove 7. A MBE method can be adopted for the formation of the undoped GaAs layer. In this case, the surface profile of the formed layer is different from that shown by the layer 9 in FIG. 3. A resist layer 10 is then applied over the undoped GaAs layer 9. It is possible to adopt organic material which is used in a spin coating method, instead of resist material.

Figure 4:
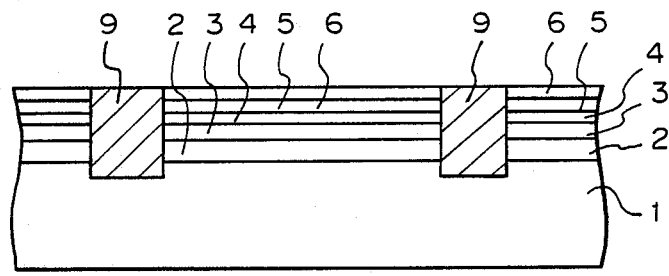
Figure 5:
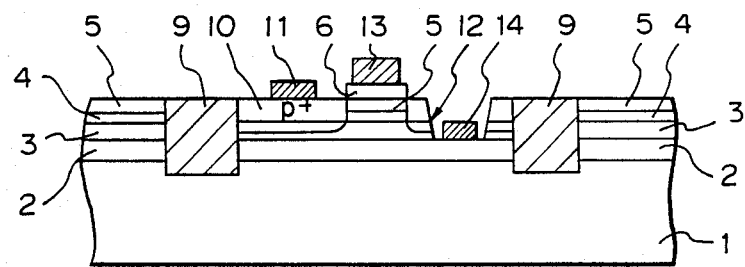

Next, the resist layer 10 and the undoped GaAs layer 9 are etched by an ion-milling method using $Ar^+$ ions, to leave a portion of the GaAs layer 9 within the groove 7, as shown in FIG. 4. The mixture ratio of $CF_4$ to $O_2$ is controlled to equalize an etch rate of the resist with that of the GaAs. Thus, the U-shaped groove is filled with the intrinsic GaAs layer to complete the isolation structure.

The hetero-bipolar transistor (FIG. 5) is formed in the isolated active region as follows. A resist pattern (not shown) is formed on a portion of the top GaAs layer 6 corresponding to an emitter region. Using the resist pattern as a mask, the top GaAs layer 6 is etched by a suitable etching method (e.g., a RIE method using a reactive gas of $CCl_2F_2$ and a diluent gas of He). Another resist pattern (not shown) having an opening corresponding to a base region is formed on the exposed surface. Magnesium ions ($Mg^+$) or Beryllium ions ($Be^+$) are introduced into the layers 5, 4, and 3 through the opening by an ion-implantation method to form a $p^+$-type region 10. An annealing treatment after ion-implantation is performed either at a temperature of 700° C. for one hour in a furnace, or at a temperature of from 750° C. to 900° C. for 1 to 20 seconds by a lamp. A base electrode 11 of, e.g., Cr/Au, is selectively formed on the $p^+$-type region 10. Then, the layers 5, 4, and 3 are selectively etched to form a groove 12 for a collector contact extending beyond the $p^+$-type region 10. At the same time, an emitter electrode 13 and a collector electrode 14 are selectively formed on the top GaAs layer 6 and on the GaAs layer 2, respectively. These electrodes 13 and 14 are made of, e.g., AuGe/Au. A heat-treatment (a so-called alloying treatment) for the electrodes 13 and 14 is performed at a temperature from 400° to 450° C. for 5 seconds to 5 minutes. Thus, the transistor is completed.

In the above description, the $n^+$-type GaAs layer 2 is a sub-collector layer for decreasing a collector series resistance; the n-type GaAs layer 3 is a collector layer; the $p^+$-type GaAs layer 4 is a base layer; the n-type AlGaAs layer 5 is an emitter layer, e.g., a wide gap emitter layer; and the $n^+$-type GaAs layer 6 is a contact layer for decreasing a contact resistance of an emitter.

In this embodiment, the filler intrinsic GaAs layer is epitaxially grown to be a single crystal having a thermal expansion coefficient of $8.7 \pm 0.1 \times 10^{-6}$ (1/K). Since this coefficient is equal to or very close to that of each of the layers 2 to 6 and the substrate 1, an internal stress causing cracks is not generated in the obtained structure. Also, interfaces between two adjoining materials selected from the filler GaAs 9, each of the layers 2 to 6, and the substrate 1 are subjected to substantially no stress, and thus the interfaces do not have an adverse influence on the properties of the elements. The epitaxially grown intrinsic GaAs layer 9 has a good quality interface with the layers 2 to 6 and substrate 1 and has a small number of interface traps. On the other hand, a filler insulating layer has a large number of interface traps and the fixed charge formed at the interface may vary a potential distribution and generate a surface leakage current and a surface recombination current. Furthermore, when the wide gap emitter layer is adopted, a counter injection from base to emitter does not occur, although the impurity concentration of the base region is increased. Therefore, it is possible to make use of the special characteristics, such as a high emitter injection efficiency and low base resistance, of the hetero-bipolar transistor.

Figure 6:
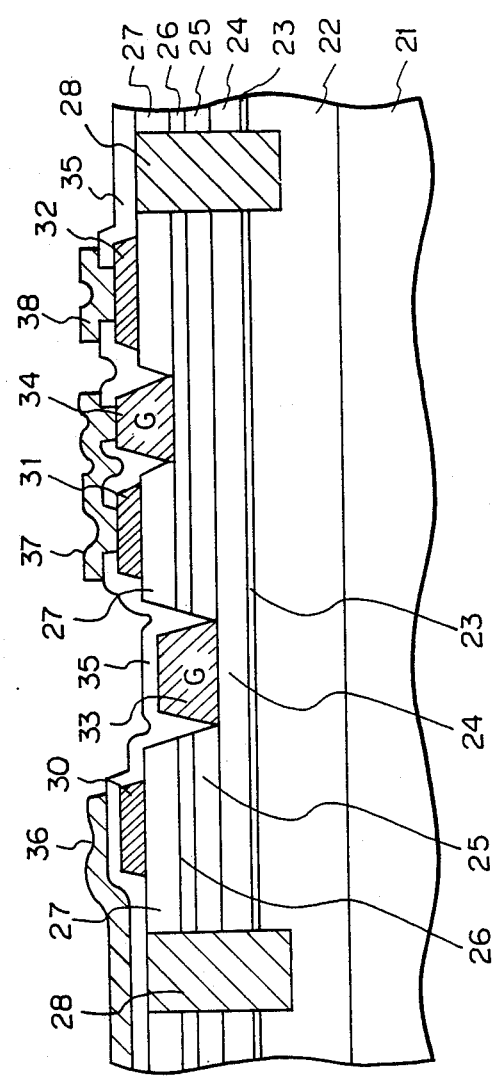
FIG. 6 is a schematic partially sectional view of another GaAs IC device according to the present invention.

FIG. 6 is a schematic partially sectional view of a GaAs IC device having an enhancement-mode GaAs FET and a depletion-mode GaAs FET, which FETs utilize a two-dimensional electron gas, according to a second embodiment of the present invention. On a semi-insulating GaAs substrate (wafer) 21, an undoped GaAs layer 22, an undoped AlGaAs layer (a spacer layer) 23, an n-type AlGaAs layer (electron-supply layer) 24, an n-type GaAs layer 25, an etching stoppable n-type AlGaAs layer 26, and a contact n-type GaAs layer 27 are formed in sequence by an MBE method or an MOCVD method. It is possible to omit the undoped AlGaAs layer 23. The layers 22 to 27 are selectively etched to form a U-shaped groove extending into the undoped GaAs layer 22. The groove is filled with intrinsic (i.e., undoped) GaAs 28 in a manner similar to that of the first embodiment. The groove containing the filler of intrinsic GaAs 28 surrounds an active region (i.e., a portion of the laminated layer) to isolate that region from another region. It is possible to adopt a p-type GaAs instead of the intrinsic GaAs, since all of the layers 24 to 27 have n-type conductivity and there is no p-type layer. Ohmic contact electrodes 30, 31, and 32 of AuGe/Au are selectively formed on the n-type GaAs layer 27. A heat-treatment for alloying (e.g., at 450° C. for 1 minute) is carried out. Then, portions of the GaAs layer 27 and the AlGaAs layer 26 corresponding to a gate region of the enhancement-mode FET are etched by a suitable etching method. Portions of the GaAs layers 25 and 27 are simultaneously etched to form a groove for the gate electrode of the enhancement-mode FET and a groove for the gate of the depletion-mode FET. This etching treatment is carried out by an RIE method using an etchant gas of $CCl_2F_2$ and a diluent or carrier gas of He, since an etch rate of GaAs is about 200 times larger than that of AlGaAs. A gate electrode 33 and a gate electrode 34 of Ti/Pt/Au are selectively formed on the AlGaAs layers 24 and 26, respectively. An insulating layer 35 of, e.g., $SiO_2$, is deposited on the entire exposed surface and is selectively etched to form contact holes. Then interconnecting conductor lines 36, 37, and 38 of Ti/Au are formed. Thus, the GaAs IC device in which the enhancement-mode and depletion-mode GaAs FETs are formed in the isolated active region, is produced.

Figure 7:
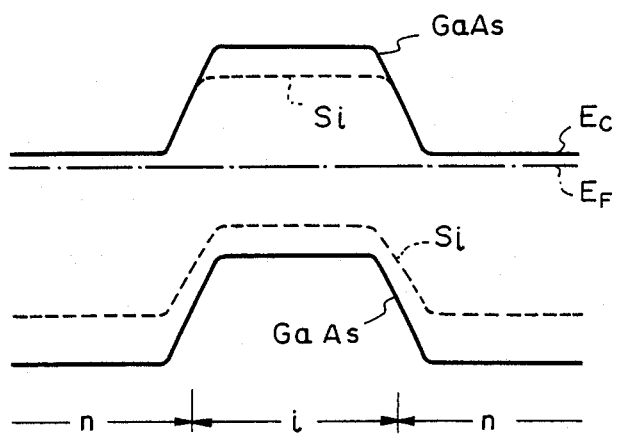
FIG. 7 is an energy band diagram for n-i-n type GaAs and Si structures.

Referring to FIG. 7, the effect of an intrinsic semiconductor layer sandwiched between two n-type semiconductor layers is now explained. An energy band of the n-i-n type GaAs layers is indicated by solid lines and that of the n-i-n type Si layer is indicated by broken lines. As is evident from FIG. 7, the barrier height of the intrinsic GaAs layer is higher than that of the intrinsic Si layer. In the case of the GaAs layers, it is very difficult for electrons to pass over the barrier, so that the intrinsic GaAs layer can serve as an isolation layer. In the case of the Si layers, electrons can pass over the barrier, so that generally the intrinsic Si layer is not used for the isolation layer.

It will be obvious that the present invention is not restricted to the above-mentioned embodiments and that many variations are possible for persons skilled in the art without departing from the scope of the invention. For example, prior to the formation of the intrinsic GaAs layer, an $SiO_2$ layer may be formed on the top GaAs layer. The portion of the intrinsic GaAs layer deposited on the $SiO_2$ layer becomes polycrystalline. The polycrystalline GaAs can be etched faster than the single crystalline GaAs, and the $SiO_2$ layer is then removed. Furthermore, the isolation structure according to the present invention can be used in a HET (Hot Electron Transistor) IC or a RHET (Resonant Hot Electron Transistor) IC, which are disclosed in, e.g., U.S. Ser. No. 754,416.

We claim:

1. A method for producing a semiconductor integrated circuit device comprising the steps of:
    (a) providing a compound semiconductor substrate having a semi-insulating compound semiconductor surface region;
    (b) forming an active element laminated layer on the surface region including compound semiconductor layers having a first conductivity type and a second conductivity type opposite the first conductivity type, respectively;
    (c) forming a groove extending into the surface region by etching portions of the laminated layer and the surface region;
    (d) filling the groove with a semi-insulating compound semiconductor so as to form an isolation region for electrically isolating active elements from each other; and
    (e) forming an active element in the isolated regions of the laminated layer.

2. A method according to claim 1, wherein said steps a) and b) include forming the compound semiconductor of the surface region and the laminated layer of a Group III-V compound semiconductor.

3. A method according to claim 2, wherein said step a) includes forming the compound semiconductor of a material selected from the group consisting of $Ga_xIn_{1-x}As_yP_{1-y}$, $Ga_xAl_{1-x}As_yP_{1-y}$, $Ga_xAl_{1-x}As_xSb_{1-x}$, $In_xGa_yAl_{1-x-y}P$, $In_xAl_{1-x}P_xAs_{1-x}$, $In_xAl_{1-x}P_xSb_{1-x}$, and $Ga_xAl_{1-x}P_xSb_{1-x}$: wherein
$0 \leq x \leq 1$ and
$0 \leq y \leq 1$.

4. A method according to claim 1, wherein said step d) includes forming the semi-insulating compound semiconductor of the isolation region of an intrinsic Group III-V compound semiconductor.

5. A method according to claim 4, wherein said step d) further comprises the substep of forming the intrinsic compound semiconductor of a material selected from the group consisting of $Ga_xIn_{1-x}As_xP_{1-x}$, $Ga_xAl_{1-x}As_yP_{1-y}$, $Ga_xAl_{1-x}As_xSb_{1-x}$, $In_xGa_yAl_{1-x-y}P$, $In_xAl_{1-x}P_xAs_{1-x}$, $InAl_{1-x}P_xSb_{1-x}$, and $Ga_xAl_{1-x}P_xSb_{1-x}$: wherein
$0 \leq x \leq 1$ and
$0 \leq y \leq 1$.

6. A method according to claim 1, wherein said step b) of forming the active element laminated layer includes the substeps of:
    (i) forming a collector semiconductor layer having the first conductivity type;
    (ii) forming a base semiconductor layer having the second conductivity type; and
    (iii) forming an emitter semiconductor layer having the first conductivity type, and
wherein said step e) of forming the active elements includes the substeps of:
    (i) forming a collector electrode on the collector semiconductor layer;
    (ii) forming a base electrode on the base semiconductor layer; and
    (iii) forming an emitter electrode on the emitter semiconductor layer.

* * * * *